United States Patent [19]
Ivanov

[11] Patent Number: 6,150,883
[45] Date of Patent: Nov. 21, 2000

[54] RAIL-TO-RAIL INPUT/OUTPUT OPERATIONAL AMPLIFIER AND METHOD

[75] Inventor: Vadim V. Ivanov, Tucson, Ariz.

[73] Assignee: Burr-Brown Corporation, Tucson, Ariz.

[21] Appl. No.: 09/359,482

[22] Filed: Jul. 22, 1999

[51] Int. Cl.[7] .................................................. H03F 3/45
[52] U.S. Cl. ......................................... 330/253; 330/255
[58] Field of Search .................................... 330/253, 255, 330/261

[56] References Cited

U.S. PATENT DOCUMENTS

| | | | |
|---|---|---|---|
| 5,337,008 | 8/1994 | Badyal | 330/253 |
| 5,515,003 | 5/1996 | Kimura | 330/253 |
| 6,043,708 | 3/2000 | Barr | 330/253 |
| 6,052,025 | 4/2000 | Chang et al. | 330/253 |

*Primary Examiner*—Steven J. Mottola
*Attorney, Agent, or Firm*—Cahill, Sutton & Thomas P.L.C.

[57] ABSTRACT

A differential amplifier includes a rail-to-rail input stage including differentially coupled first (13) and second (14) P-channel input transistors, and differentially coupled third (17) and fourth (18) N-channel input transistors. The drains of the first and second input transistors are coupled to a first folded cascode circuit which includes first (25) and second (26) P-channel cascode transistors. The drains of the third and fourth input transistors are coupled to a second folded cascode circuit which includes third (36) and fourth (37) N-channel cascode transistors. An output stage includes a P-channel pull-up transistor and an N-channel pull-down transistor and a class AB bias circuit coupled between the gates thereof. The gates of the first (25) and third (36) cascode transistors are coupled to first and second reference voltages, respectively. A first gain boost circuit (58) amplifies signals on the drains of first and second input transistors to produce a bias signal on the gate of the second cascode transistor (26) coupled to the gate of the pull-up transistor. A second gain boost circuit (57) amplifies signals on the drains of third and fourth input transistors to produce a bias signal on the gate of the fourth cascode transistor (37) coupled to the gate of the pull-down transistor.

17 Claims, 4 Drawing Sheets

RAIL-TO-RAIL INPUT/OUTPUT OPERATIONAL AMPLIFIER AND METHOD

BACKGROUND OF THE INVENTION

The invention relates generally to the field of differential amplifiers and operational amplifiers, and more particularly to an integrated circuit amplifier having a rail-to-rail common mode range both at the amplifier inputs and the amplifier output, and still more particularly to such an operational amplifier which is capable of linear, high speed operation with a rail-to-rail supply voltage of as little as approximately 1.2 volts.

The closest prior art includes U.S. Pat. No. 5,311,145 entitled "Combination Driver-Summing Circuit for Rail-to-Rail Differential Amplifier" issued May 10, 1994 to Huijsing et al. and incorporated herein by reference, the article "Compact Low-Voltage Power-Efficient Cells for VLSI", by K. Langen and J. Huijsing, IIIE Journal of Solid State Circuits, Volume 33, No. 10, pp. 1482–1496, and the article "Design Aspects of Rail-to-Rail CMOS OpAmp", by Gierkink, Holzmann, Wiegerink, and Wassenaar, proceedings of the 1st VLSI Workshop, May 6–8, 1997, Columbus, Ohio, pp. 23–28.

FIG. 1 of prior art U.S. Pat. No. 5,311,145 discloses an operational amplifier capable of "rail-to-rail operation". It includes a differential amplifier input stage that includes two pairs of differentially coupled input transistors, one with a tail current to the positive rail and the other with a tail current to the negative rail. A summing circuit is divided into first and second parts biased with a current from a single common floating current source to combine. The drain electrodes of the first pair of input transistors are coupled to the first part, and the drain electrodes of the second par of input transistors are coupled to the second part. A class A-B driver/output stage is coupled to the summing circuit to drive at least one output signal and which is operative over nearly the full rail-to-rail supply voltage range. The article by Langen and Huijsing mainly discloses the circuitry in U.S. Pat. No. 5,311,145 in more detail. The paper by Gierkink, Holzmann, Wiegerink, and Wassenaar discloses use of a gain boost amplifier with a cascode connection and a differential amplifier. The circuitry disclosed in this reference is very complex, and needs a large compensation capacitor. There is a need to provide a simpler circuit.

The circuit described in U.S. Pat. No. 5,311,145 is a two-stage circuit that does not have the capability of operating at a rail-to-rail supply voltage of less than approximately 2.2 volts. The gain of this circuit is too low for many applications. The speed-power figure of merit for the circuits described in U.S. Pat. No. 5,311,145 is much lower than desirable at the lower rail-to-rail supply voltage.

Accordingly, there is an unmet need for a much faster rail-to-rail input/output operational amplifier operable at lower rail-to-rail supply voltages than the closest prior art and also operable at a much higher gain-speed-power figure of merit even at the lowest end of the rail-to-rail supply voltage range.

SUMMARY OF THE INVENTION

Accordingly, it is an object of the invention to provide an operational amplifier or differential amplifier which is linearly operable at a lower range of rail-to-rail supply voltages than the closest prior art.

It is another object of the invention to provide a differential amplifier or operational amplifier operable from lower supply voltages and having a substantially higher gain-speed-power figure of merit than the closest prior art, even at lower rail-to-rail supply voltage levels than those at which the closest prior art differential or operational amplifiers are operable.

Briefly described, and in accordance with one embodiment thereof, the invention provides a differential amplifier with a rail-to-rail common mode input voltage range, including a first supply voltage rail (V+) and a second supply voltage rail (V−), first (11) and second (12) input terminals for receiving a differential input signal, a rail-to-rail input stage, a first and second summing circuit, a current bias circuit for the summing circuitry, and an output stage. The rail-to-rail input stage includes first (13) and second (14) input transistors of a first conductivity type each including a first electrode coupled to a first terminal of a first current source (20) having a second terminal coupled to the first supply voltage rail (V+), and third (17) and fourth (18) input transistors of a second conductivity type each including a first electrode coupled to a first terminal of a second current source (16) having a second terminal coupled to the second supply voltage rail (V−). A first current summing circuit includes first (23) and second (24) current source transistors each having a first electrode coupled to the first supply voltage rail (V+), the first current source transistor (23) having a second electrode coupled to a second electrode of the first input transistor (13) and a first electrode of a first cascode transistor (25), the second current source transistor (24) having a second electrode coupled to a second electrode of the second input transistor (14) and a first electrode of a second cascode transistor (26), a control electrode of each of the first (25) and second (26) cascode transistors being coupled to a first reference voltage ($V_{REF1}$) A second current summing circuit includes third (34) and fourth (35) current source transistors each having a first electrode coupled to the second supply voltage rail (V−), the third current source transistor (34) having a second electrode coupled to a second electrode of the third input transistor (17) and a first electrode of a third cascode transistor (36), the fourth current source transistor (35) having a second electrode coupled to a second electrode of the fourth input transistor (18) and a first electrode of a third cascode transistor (37), the third (36) and fourth (37) cascode transistors each having a control electrode coupled to a second reference voltage ($V_{REF2}$). The output stage includes a first output transistor (30) having a first electrode coupled to the first supply voltage rail (V+), a second electrode coupled to an output conductor (31), and a control electrode coupled to a second electrode of the second cascode transistor (26) and to a first terminal of a class AB bias circuit (29), and a second output transistor (45) having a first electrode coupled to the second supply voltage rail (V−), a second electrode coupled to the output conductor (31), and a control electrode coupled to a second electrode of the fourth cascode transistor (37) and a second terminal of the class AB bias circuit (29). The current bias circuit includes a fifth cascode transistor (40) having a control electrode coupled to the second bias voltage source ($V_{REF2}$) and a first electrode coupled to a first terminal of a third current source (42) having a second terminal coupled to the second supply voltage rail (V−), a bias amplifier (43) having a first (−) input coupled to the first electrode of the fifth cascode transistor, a second input (+) coupled to the second terminal of the third current source transistor (34), and an output coupled to control electrodes of the third (34) and fourth (35) current source transistors.

In another embodiment, the control electrodes of the second (26) and fourth (37) cascode transistors are not coupled to the first ($V_{REF1}$) or second ($V_{REF2}$) reference voltages. Instead, a first gain boost amplifier (58) has an output coupled to the control electrode of the second cascode transistor (26) and a pair of differential inputs coupled to the second electrodes of the first (13) and second (14) input transistors, respectively. A second gain boost amplifier (57) has an output coupled to the control electrode of the fourth cascode transistor (37), and a pair of differential inputs coupled to the second electrodes of the third (17) and fourth (18) input transistors, respectively.

DETAILED DESCRIPTION OF THE PREFERRED EMBODIMENTS

Figure 1:
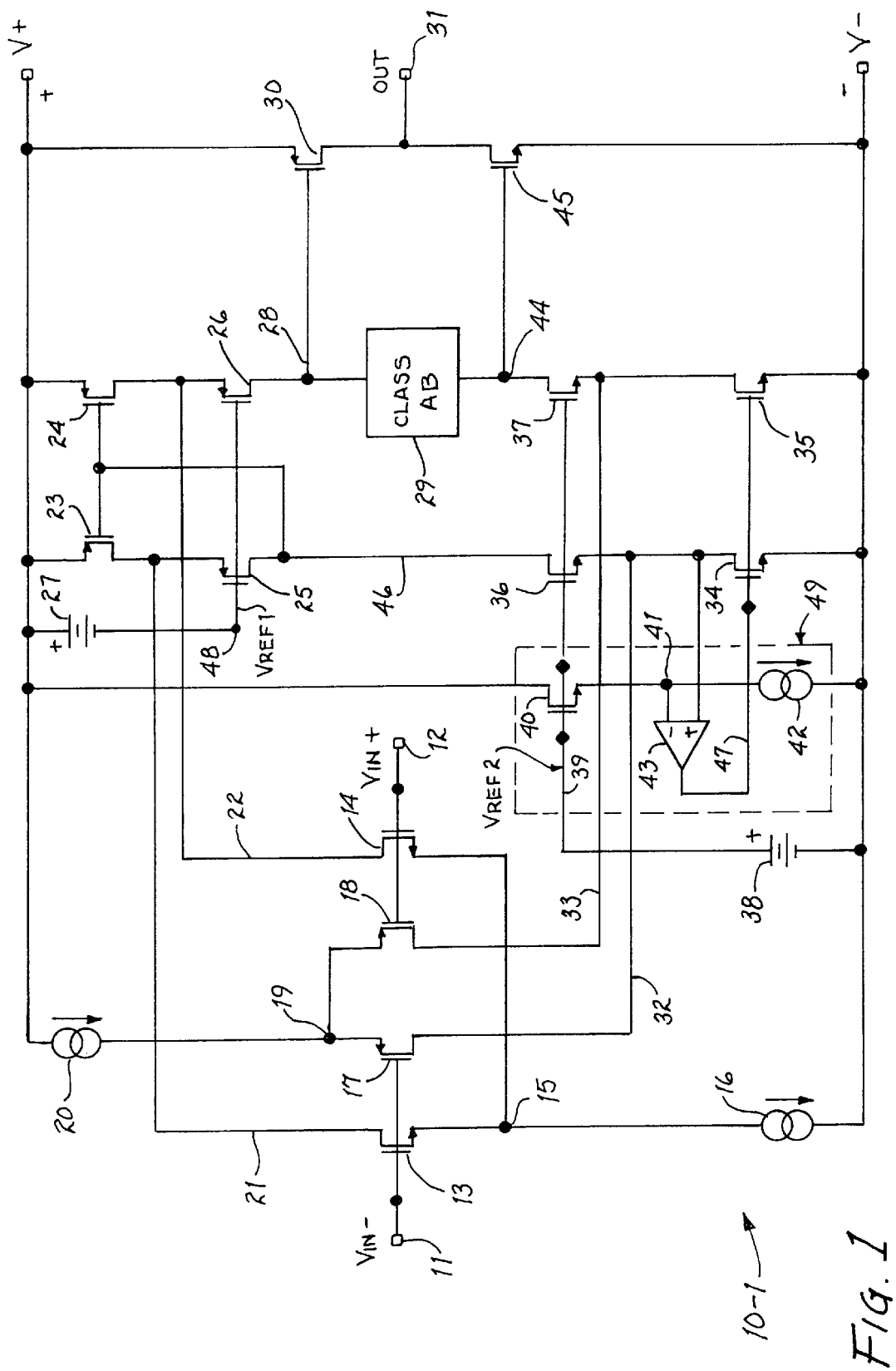
FIG. 1 is a schematic diagram of a first embodiment of an operational amplifier of the present invention.

Referring to FIG. 1, a first operational amplifier 10-1 includes a differential input stage including N-channel MOSFETs 13 and 14, P-channel MOSFETs 17 and 18, and constant current sources 16 and 20. The gate electrodes of MOSFETs 13 and 17 are connected to input conductor 11 which receives an input voltage $V_{IN-}$. The gate electrodes of MOSFETs 14 and 18 are connected to input conductor 12, which receives an input voltage $V_{IN+}$. The sources of N-channel input MOSFETs 13 and 14 are connected by conductor 15 to one terminal of constant current source 16, the other terminal of which is connected to a lower supply rail voltage V−. The sources of P-channel input MOSFETs 17 and 18 are connected by conductor 19 to one terminal of constant current source 20, the other terminal of which is connected to a higher supply rail voltage V+. This input stage is the same as in FIG. 1 of above mentioned U.S. Pat. No. 5,311,145 and its operation is fully described therein.

The collectors of N-channel input MOSFETs 13 and 14 are connected by conductors 21 and 22 to the drains of P-channel current mirror MOSFETs 23 and 24, the sources of which are connected to V+. The gate electrodes of current mirror MOSFETs 23 and 24 are connected by conductor 46 to the drain of a P-channel cascode MOSFET 25 having its source connected by conductor 21 to the drains of N-channel input MOSFET 13 and P-channel current mirror MOSFET 23. The drain of P-channel current mirror MOSFET 24 is connected by conductor 22 to the source of a P-channel cascode MOSFET 26, the drain of which is connected by conductor 28 to one terminal of a class AB bias circuit 29 and to the gate of a P-channel output MOSFET 30 having its source connected to V+ and its drain connected to output conductor 31.

Class AB bias circuit 29 of FIG. 1 herein can be the same as the class AB bias circuit designated by reference numeral 20 in FIG. 1 of above mentioned U.S. Pat. No. 5,311,145, and its structure and operation are fully described therein. The gate electrodes of cascode MOSFETs 25 and 26 are connected to a reference voltage $V_{REF1}$] produced on terminal 48 of the lower voltage of a constant voltage circuit 27 having its other terminal connected to V+.

The drain electrodes of P-channel input MOSFETs 17 and 18 are connected by conductors 32 and 33 to drain electrodes of N-channel current source MOSFETs 34 and 35. The sources of N-channel current mirror MOSFETs 34 and 35 are connected to V−. The drain of current mirror MOSFET 34 is connected by conductor 32 to the (+) input of an amplifier 43. The (−) input of amplifier 43 is connected by conductor 41 to the source of an N-channel cascode transistor 40 having its drain connected to V+ and its gate connected to the (+) terminal of a constant reference voltage circuit 38 having its (−) terminal connected to V−. The output of amplifier 43 is connected to the gates of N-channel current source MOSFETs 34 and 35. The drains of N-channel current source MOSFETS 34 and 35 are connected to the sources of N-channel cascode MOSFETs 36 and 37, which have their gate electrodes connected by conductor 39 to reference voltage source circuit 38. The drain of N-channel cascode MOSFET 36 is connected to conductor 46. The drain of cascode MOSFET 37 is connected by conductor 44 to another terminal of class AB bias circuit 29 into the gate electrode of N-channel output MOSFET 45, which has its drain connected to output conductor 31 and its source connected to V−.

Figure 4:
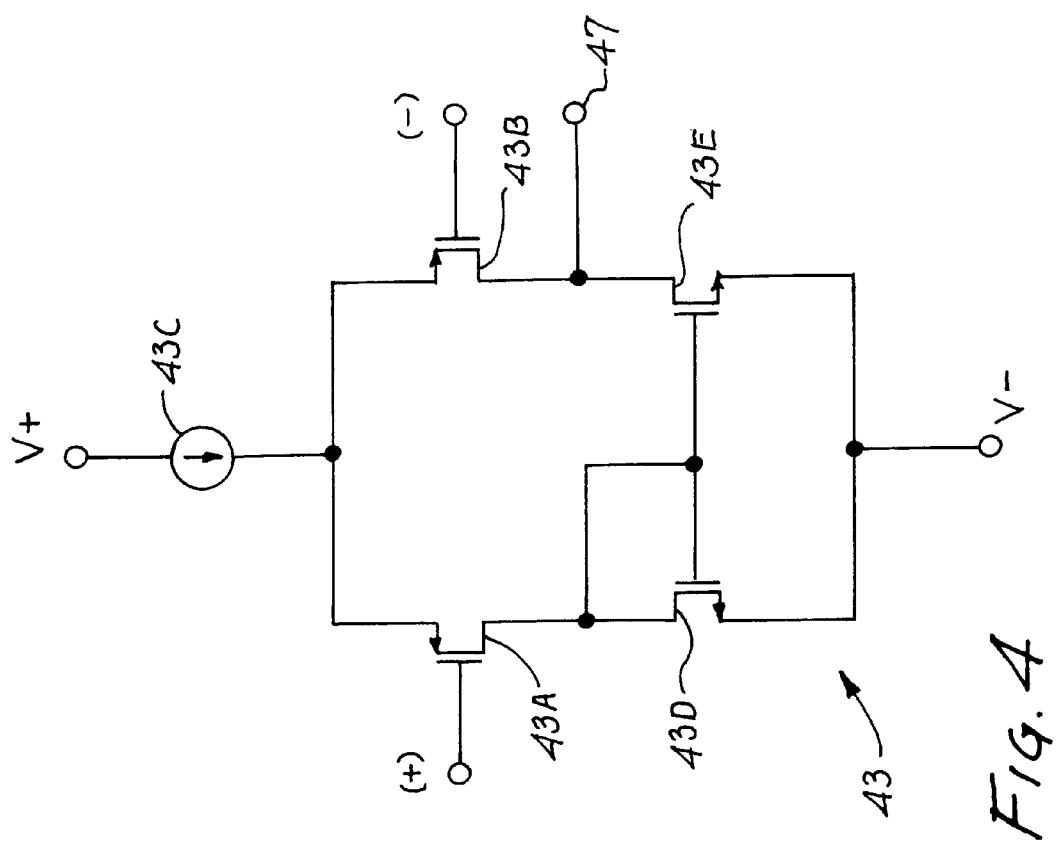
FIG. 4 is a schematic design of amplifier 43 in FIGS. 1–3.

Referring to FIG. 4, amplifier 43 is a simple differential amplifier having its (+) and (−) inputs connected to the gates of P-channel input MOSFETs 43A and 43B, respectively. The sources of MOSFETs 43A and 43B are connected to one terminal of a constant source 43C, which can be a P-channel current mirror output MOSFET. The other terminal of the constant current source 43C is connected to the positive supply rail voltage V+. The drain of MOSFET 43A is connected to the drain and gate of an N-channel MOSFET 43D, the source of which is connected to the negative supply rail V−. MOSFET 43D functions as a load device for input MOSFET 43A and as a current mirror control transistor for N-channel MOSFET 43E, the gate, drain, and source of which are connected to the gate of MOSFET 43A, the drain of input MOSFET 43B, and V−, respectively. MOSFET 43E functions as a current mirror output transistor and as a load for input MOSFET 43D. The output 47 of amplifier 43 is connected to the drains of MOSFETs 43B and 43E in FIG. 1. Amplifier 43 can operate on a very low rail-to-rail supply voltage, and allows amplifier 10-1 to also operate at a very low supply rail-to-rail supply voltage.

Referring again to FIG. 1, it should be noted that the floating circuit source of prior art U.S. Pat. No. 5,311,145 is not used to bias the summing circuitry including MOSFETs 23 and 24 and MOSFETs 34 and 35. Instead, above described source follower MOSFET 40, bias amplifier 43, and current source 42 are provided as a current bias circuit 49 in FIG. 1 by dotted lines.

The circuit of FIG. 1 provides linear operation if the difference between V+ and V− is greater than the sum of the threshold voltage of MOSFET 23, the drain-source voltage of cascode MOSFET 36 or 37, and the drain-source voltage of current source MOSFET 34 or 35. Since the threshold voltage of MOSFET 23 is typically about 900 millivolts and the drain-source voltages of current source MOSFET 34 or 35 and cascode MOSFET 36 or 37 are approximately 200 millivolts each. Therefore, the minimum supply voltage is the sum of 900 millivolts plus 200 millivolts plus 200 millivolts, or 1.3 volts. The minimum operating voltage of the operational amplifier 10-1 of FIG. 1 is approximately 1.3 volts.

Figure 2:
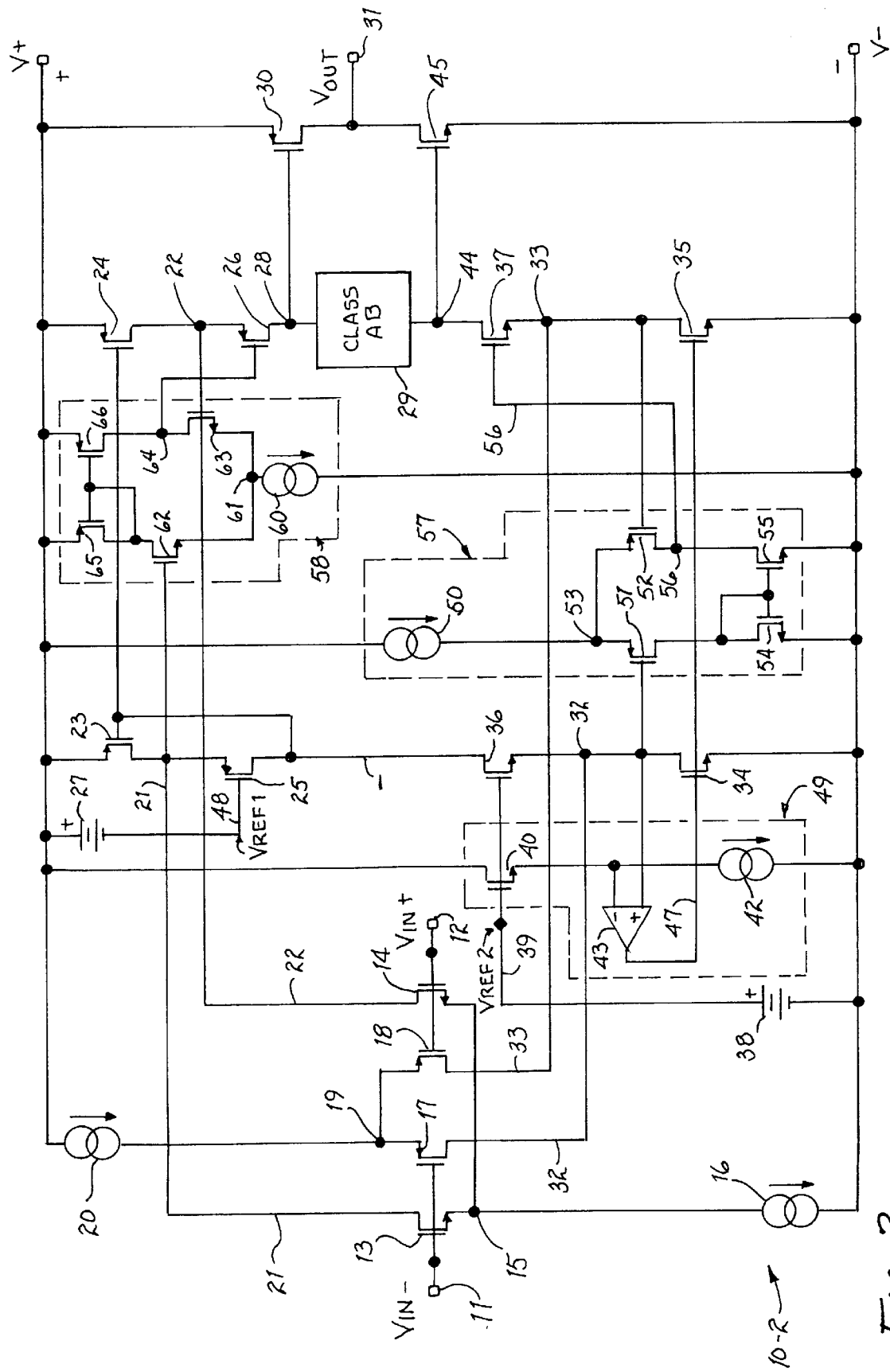
FIG. 2 is a schematic diagram of another embodiment of the invention in which higher gain is achieved than for the circuit of FIG. 1.

Referring to FIG. 2, a second operational amplifier 10-2 of the present invention includes an input stage which can be identical to that of the operational amplifier 10-1 of FIG. 1, wherein the same reference numerals are used to identify corresponding circuit elements. The circuit including amplifier 43, current source 42, and the circuitry including reference voltage circuit 27, current mirror transistors 23 and 24, P-channel cascode transistors 25 and 26, output MOSFETs 30 and 45, class AB bias circuit 29, P-channel cascode transistors 25 and 26, and N-channel cascode transistors 40, 36, and 37 are the same as in FIG. 1.

However, in FIG. 2 the gates of cascode MOSFETs 26 and 37 are not connected to $V_{REF1}$ and $V_{REF2}$, respectively. Instead, the gate of cascode MOSFET 26 is connected by conductor 64 to the output of a gain boost amplifier 58 that includes differentially connected N-channel input MOSFETs 62 and 64 and P-channel current mirror load MOSFETs 65 and 66. The drains of N-channel input MOSFETs 13 and 14 are connected to the gate electrodes of N-channel input MOSFETs 62 and 63, the sources of which are coupled by conductor 61 to a constant current source 60 that is connected to V−. P-channel MOSFETs 65 and 66 form a current mirror circuit which functions as the load devices for input MOSFETs 62 and 63. MOSFETs 62, 63, 65, and 66 in current source 60 thus form the simple differential gain boost amplifier 58, the inverting output 64 of which is connected to the gate of P-channel cascode MOSFET 26.

The body electrodes of N-channel input MOSFETs 62 and 63 are connected to V−. This results in a source-to-body reverse bias voltage that increases their threshold voltages to a value 200 to 400 millivolts greater than the threshold of P-channel cascode MOSFET 26. This allows linear operation of MOSFET 52.

Similarly, the gate of cascode MOSFET 37 is connected by conductor 56 to the output of another gain boost amplifier 57 which includes differentially connected P-channel input MOSFETs 51 and 52 and N-channel current mirror load MOSFETs 54 and 55. Constant current source 50 can be an ordinary P-channel current mirror output transistors connected between V+ and conductor 53, and constant current mirror 60 can be an N-channel current mirror output transistor connected between V− and conductor 61. Gain boost amplifiers 57 and 58 therefore operate with a very low rail-to-rail supply voltage, and allow amplifier 10-2 of FIG. 2 to operate with a very low rail-to-rail supply voltage, and provide greatly increased gain over the amplifier 10-1 in FIG. 1 and any of the amplifiers of the closest prior art.

The drains of P-channel input MOSFETs 17 and 18 are connected by conductors 32 and 33 to the gates of P-channel input MOSFETs 51 and 52 of another simple differential amplifier including N-channel current mirror transistors 54 and 55 as load devices and current source 50 providing a tail current from V+. The body electrodes of P-channel input MOSFETs 51 and 52 are connected to V+. This results in a source-to-body reverse bias voltage that increases their threshold voltages to a value 200 to 403 millivolts greater than the threshold of cascode MOSFET 37, the gate of which is connected to the inverting output 56 of the intermediate differential stage. This allows linear operation of MOSFET 63.

The provision of the gain boost amplifier 58 provides amplification of the input signal through two paths, one through the source of cascode MOSFET 26 and the other through the gate of cascode MOSFET 26. The first amplification path through the source of cascode transistor 26 is a high frequency signal amplification path, and the second amplification path through the gate of cascode MOSFET 26 is a lower frequency amplification path in parallel with the first. This results in an increase of approximately 50 dB of gain at low frequencies.

My simulations and measurements indicate that the gain multiplied by the speed divided by the power for the circuit of FIG. 2 is approximately 5 to 10 times better than the speed-power ratio of the circuits shown in U.S. Pat. No. 5,311,145.

Figure 3:
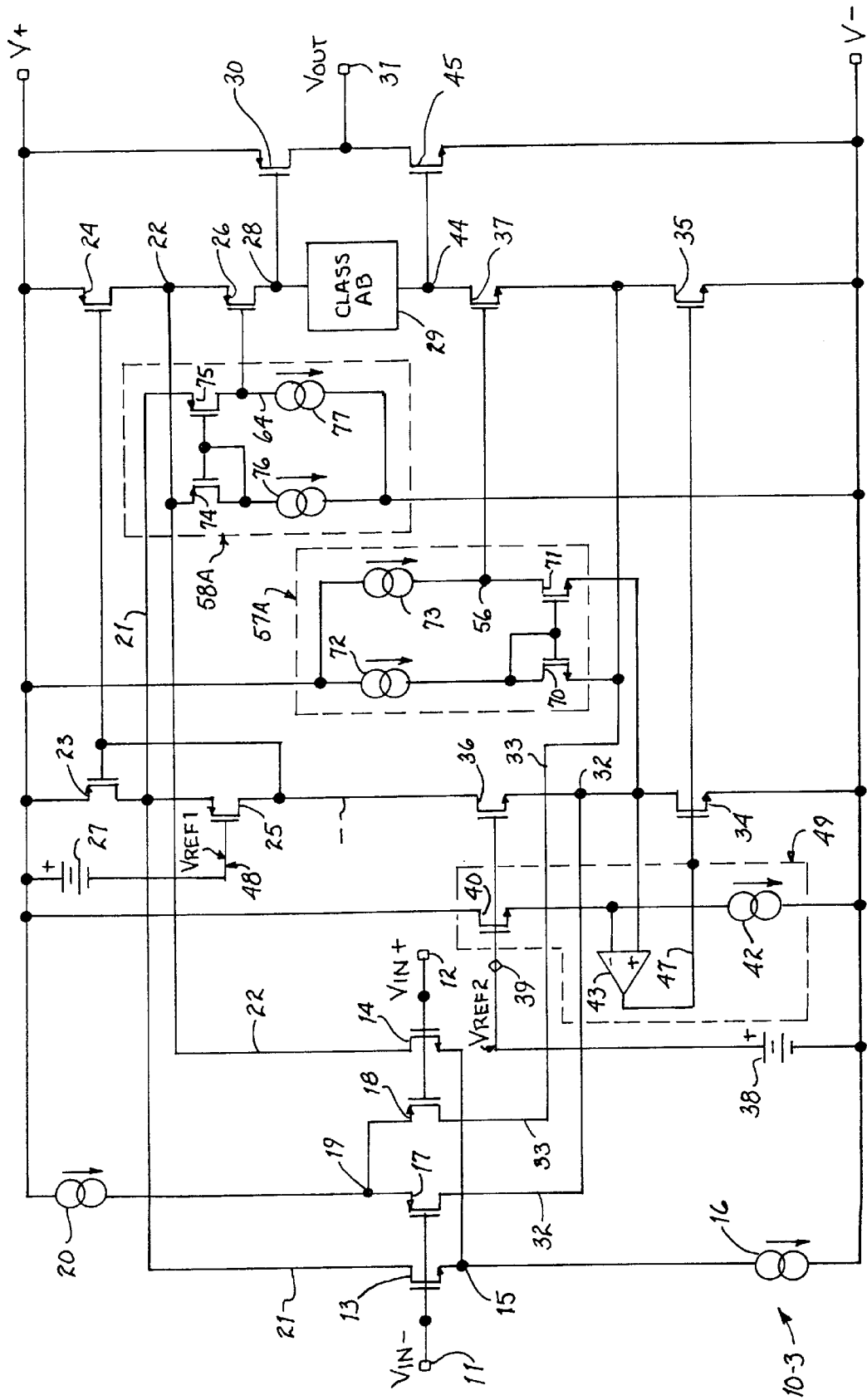
FIG. 3 is a schematic diagram of a third embodiment of the invention in which higher gain is achieved than for the circuit of FIG. 1.

Referring to FIG. 3, a third operational amplifier 10-3 of the present invention includes an input stage identical to that of FIG. 2. The gain boost circuitry including differential amplifier 43, current source 42, and N-channel cascode MOSFET 40 are the same as in FIG. 2. The N-channel current MOSFETs 34 and 35 are connected the same as in FIG. 2. P-channel MOSFETs 23 and 24 and P-channel MOSFETs 25 and 26 and reference voltage source circuit 27 also are connected the same as in FIG. 2. Class AB bias circuit 29 and output MOSFETs 30 and 45 also are connected the same as in FIG. 2. However, the gain boost amplifiers 57 and 58 in FIG. 3 are different than in FIG. 2, and may be advantageous for high voltage rail-to-rail supply voltages.

In FIG. 3, gain boost amplifier 58A includes P-channel input MOSFETs 74 and 75 with their sources connected as the differential inputs and constant circuit sources 76 and 77 as load devices. Gain boost amplifier 57B includes N-channel input MOSFETs 70 and 71 with their sources connected as the different inputs and constant current sources 72 and 73 as load devices. Conductor 33 is connected to the sources of N-channel MOSFETs 70 and 71. The gates of MOSFETs 70 and 71 are connected to the drain of MOSFET 70 and to one terminal of a constant current source 72, the other terminal of which is connected to V+. The drain of MOSFET 71 is connected by conductor 56 to the gate of cascode MOSFET 37 and to one terminal of constant current source 73, the other terminal of which is connected to V+.

MOSFETs 70 and 71 function as inputs of a common gate differential amplifier stage which includes current sources 72 and 73 as load devices. The source of N-channel MOSFET 70 receives the signal on conductor 33 as an input, and the source of N-channel MOSFET 71 receives the signal on conductor 32 as an input. An inverted output signal is produced on conductor 56 and applied to the gate electrode of cascode MOSFET 37. Similarly, P-channel MOSFETs 74 and 75 receive the signals on conductors 22 and 21, respectively, as input signals. Current sources 76 and 77 function as load devices, and an inverted output signal is produced on conductor 64 and applied to the gate of cascode MOSFET 26.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, in each of the described embodiments, the P-channel MOSFETs can be replaced by N-channel MOSFETs and the N-channel MOSFETs can be replaced by P=channel MOSFETs, if the polarities of the supply voltage rails and reference voltages also are reversed. The gain boost circuits as shown in FIGS. 2 and 3 also could be used in circuits which do not use the biasing circuit including cascode transistor 40, current source 42, and amplifier 43, and instead use the floating current source of above mentioned U.S. Pat. No. 5,311,145.

What is claimed is:

1. A differential amplifier with a rail-to-rail common mode input voltage range, comprising:

(a) first and second supply voltage rails, first and second input terminals, and an output terminal;

(b) a rail-to-rail input stage including
   i. differentially connected first and second input transistors of a first channel type, and differentially connected third and fourth input transistors of the second channel type;
(c) a first folded cascode current summing circuit coupled to the first supply voltage rail and including a first cascode transistor and a second cascode transistor both of the second channel type, sources of the first and second cascode transistors being coupled to drains of the first and second input transistors, respectively;
(d) a first cascode transistor bias circuit producing bias signals on gates of the first and second cascode transistors, respectively;
(e) a second folded cascode current summing circuit coupled to the second supply voltage rail and including a third cascode transistor of the first channel type and a fourth cascode transistor of the first channel type, sources of the third and fourth cascode transistors being coupled to drains of the third and fourth input transistors, respectively;
(f) a second cascode transistor bias circuit producing bias signals on gate electrodes of the third and fourth cascode transistors, respectively;
(g) an output stage including a pull-up transistor of the second channel type coupled between the first supply voltage rail and the output terminal, a pull-down transistor of the first channel type coupled between the second supply voltage rail and the output terminal, and a class AB bias circuit coupled between drain electrodes of the second and fourth cascode transistors and the gate electrodes of the pull-up and pull-down transistors; and
(h) a bias current circuit including a fifth cascode transistor of the first channel type having a gate connected to the gate of the third cascode transistor and a source coupled to a first constant current source and a first terminal of a differential bias amplifier having a second input coupled to a source of the third cascode transistor and an output coupled to first and second current source transistors of the first channel type coupled between the second supply voltage rail and the sources of the third and fourth cascode transistors.

2. The differential amplifier of claim 1 wherein the first channel type is N and the second channel type is P.

3. The differential amplifier of claim 1 wherein the first and second input transistors have their sources coupled to a second constant current source that supplies a first tail current from the first supply voltage rail, and the third and fourth input transistors have their sources coupled to a third constant current source which sinks a second tail current into the second supply voltage rail.

4. The differential amplifier of claim 3 wherein the differential bias amplifier includes differentially connected fifth and sixth input transistors of the second channel type having their sources connected to receive a third tail current from the first supply voltage rail, the fifth input transistor having a gate connected to the source of the third cascode transistor and the sixth input transistor having a gate connected to the source of the fifth cascode transistor.

5. A differential amplifier with a rail-to-rail common mode input voltage range, comprising:
(a) first and second supply voltage rails, first and second input terminals, and an output terminal;
(b) a rail-to-rail input stage including
   i. differentially connected first and second input transistors of a first channel type, and differentially connected third and fourth input transistors of the second channel type;
(c) a first folded cascode current summing circuit coupled to the first supply voltage rail and including a first cascode transistor and a second cascode transistor both of the second channel type, sources of the first and second cascode transistors being coupled to drains of the first and second input transistors, respectively;
(d) a first cascode transistor bias circuit producing bias signals on gates of the first and second cascode transistors, respectively, the first cascode transistor bias circuit including a first gain boost amplifier having an output coupled to the gate of the second cascode transistor and at least a first input coupled to the drain of at least one of the first and second input transistors;
(e) a second folded cascode current summing circuit coupled to the second supply voltage rail and including a third cascode transistor of the first channel type and a fourth cascode transistor of the first channel type, sources of the third and fourth cascode transistors being coupled to drains of the third and fourth input transistors, respectively;
(f) a second cascode transistor bias circuit producing bias signals on gate electrodes of the third and fourth cascode transistors, the second cascode transistor bias circuit including a second gain boost amplifier having an output coupled to the gate of the fourth cascode transistor and at least a first input coupled to the drain of at least one of the third and fourth input transistors;
(g) an output stage including a pull-up transistor of the second channel type coupled between the first supply voltage rail and the output terminal, a second output transistor of the first channel type coupled between the second supply voltage rail and the output terminal, and a class AB bias circuit coupled between drain electrodes of the second and fourth cascode transistors and the gate electrodes of the pull-up and pull-down transistors; and
(h) a bias current circuit adapted to cause flow of bias currents in the first, second, third, and fourth cascode transistors.

6. The differential amplifier of claim 5 wherein the first channel type is N and the second channel type is P.

7. The differential amplifier of claim 5 wherein the first and second input transistors have their sources coupled to a first constant current source that supplies a first tail current from the first supply voltage rail, and the third and fourth input transistors have their sources coupled to a second constant current source which sinks a second tail current into the second supply voltage rail.

8. The differential amplifier of claim 7 wherein the first gain boost amplifier includes a fifth input transistor of the first channel type having a gate coupled to the drain of the first input transistor and a source coupled to a source of a sixth input transistor of the first channel type having a gate coupled to the drain of the second input transistor, source electrodes of the fifth and sixth input transistors being coupled to a third constant current source that sinks a third tail current into the second supply voltage rail, a drain of the sixth input transistor being coupled to the gate of the second cascode transistor, and wherein the second gain boost amplifier includes a seventh input transistor of the second channel type having a gate coupled to the drain of the third input transistor and a source coupled to a source of an eighth input transistor of the second channel type having a gate coupled to the drain of the fourth input transistor, source electrodes of the seventh and eighth input transistors being coupled to a fourth constant current source that supplies a fourth tail current from the first supply voltage rail, a drain of the eighth input transistor being coupled to the gate of the fourth cascode transistor.

9. The differential amplifier of claim 8 wherein each of the first and second gain boost circuits includes a current mirror load circuit.

10. The differential amplifier of claim 7 wherein the first gain boost amplifier includes a fifth input transistor of the second channel type having a source coupled to the drain of the second input transistor and a gate and drain coupled to a gate of a sixth input transistor of the second channel type having a source coupled to the drain of the first input transistor, a drain of the sixth input transistor being coupled to the gate of the second cascode transistor, and wherein the second gain boost amplifier includes a seventh input transistor of the first channel type having a source coupled to the drain of the fourth input transistor, and a gate and drain coupled to a gate of an eighth input transistor of the first channel type having a source coupled to the drain of the third input transistor, a drain of the eighth input transistor being coupled to the gate of the fourth cascode transistor.

11. The differential amplifier of claim 10 wherein each of the first and second gain boost circuits includes two current sources connected as load devices.

12. The differential amplifier of claim 7 wherein the bias circuit includes a fifth cascode transistor of the first channel type having a gate connected to the gate of the third cascode transistor and a source coupled to a third constant current source and a first terminal of a differential bias amplifier having a second input coupled to a source of the third cascode transistor and an output coupled to first and second current source transistors of the first channel type coupled between the second supply voltage rail and the sources of the third and fourth cascode transistors.

13. The differential amplifier of claim 8 wherein the differential bias amplifier includes differentially connected fifth and sixth input transistors of the second channel type having their sources connected to receive a third tail current from the first supply voltage rail, the fifth input transistor having a gate connected to the source of the third cascode transistor and the sixth input transistor having a gate connected to the source of the fifth cascode transistor.

14. The differential amplifier of claim 5 wherein the first gain boost amplifier includes a second input coupled to a drain of the other of the first and second input transistors, and the second gain boost amplifier includes a second input coupled to a drain of the other of the third and fourth input transistors.

15. A differential amplifier with a rail-to-rail common mode input voltage range, comprising:
    (a) a first supply voltage rail and a second supply voltage rail;
    (b) first and second input terminals for receiving a differential input signal;
    (c) a rail-to-rail input stage including
        i. first and second input MOSFETs of a first channel type each including a source coupled to a first terminal of a first current source having a second terminal coupled to the first supply voltage rail, and
        ii. third and fourth input MOSFETs of a second channel type each including a source coupled to a first terminal of a second current source having a second terminal coupled to the second supply voltage rail;
    (d) a first current summing circuit including first and second current source MOSFETs of the second channel type each having a source coupled to the first supply voltage rail, the first current source MOSFET having a drain coupled to a drain of the first input MOSFET and a source of a first cascode MOSFET of the second channel type, the second current source MOSFET having a drain coupled to a drain of the second input MOSFET and a source of a second cascode MOSFET of the second channel type;
    (e) a first cascode MOSFET bias circuit producing bias signals on a gate of the first cascode MOSFET and on a gate of the second cascode MOSFET;
    (f) a second current summing circuit including third and fourth current source MOSFETs each having a source coupled to the second supply voltage rail, the third current source MOSFET having a drain coupled to a drain of the third input MOSFET and a source of a third cascode MOSFET of the first channel type, the fourth current source MOSFET having a drain coupled to a drain of the fourth input MOSFET and a source of a fourth cascode MOSFET;
    (g) a second cascode MOSFET bias circuit producing bias signals on a gate of the third cascode MOSFET and on a gate of the fourth cascode MOSFET;
    (h) an output stage including a first output MOSFET of the second channel type having a source coupled to the first supply voltage rail, a drain coupled to an output conductor, and a gate coupled to a drain of the second cascode MOSFET and to a first terminal of a class AB bias circuit, and a second output MOSFET of the first channel type having a source coupled to the second supply voltage rail, a drain coupled to the output conductor, and a gate coupled to a drain of the fourth cascode MOSFET and a second terminal of the class AB bias circuit; and
    (i) a bias circuit including a fifth cascode MOSFET of the first channel type having a gate coupled to the second cascode MOSFET bias circuit and a source coupled to a first terminal of a third current source having a second terminal coupled to the second supply voltage rail, a bias amplifier having a first (−) input coupled to the source of the fifth cascode MOSFET, a second input (+) coupled to the second terminal of the third current source MOSFET, and an output coupled to gates of the third and fourth current source MOSFETs.

16. A differential amplifier with a rail-to-rail common mode input voltage range, comprising:
    (a) a first supply voltage rail and a second supply voltage rail;
    (b) first and second input terminals for receiving a differential input signal;
    (c) a rail-to-rail input stage including
        i. first and second input MOSFETs of a first channel type each including a source coupled to a first terminal of a first current source having a second terminal coupled to the first supply voltage rail, and
        ii. third and fourth input MOSFETs of a second channel type each including a source coupled to a first terminal of a second current source having a second terminal coupled to the second supply voltage rail;
    (d) a first current summing circuit including first and second current source MOSFETs of the second channel type each having a source coupled to the first supply voltage rail, the first current source MOSFET having a drain coupled to a drain of the first input MOSFET and a source of a first cascode MOSFET, the second current source MOSFET having a drain coupled to a drain of the second input MOSFET and a source of a second cascode MOSFET, a gate of the first cascode MOSFET being coupled to a first reference voltage;

(e) a second current summing circuit including third and fourth current source MOSFETs of the first channel type each having a source coupled to the second supply voltage rail, the third current source MOSFET having a drain coupled to a drain of the third input MOSFET and a source of a third cascode MOSFET, the fourth current source MOSFET having a drain coupled to a drain of the fourth input MOSFET and a source of a fourth cascode MOSFET, the third cascode MOSFET having a gate coupled to a second reference voltage;

(f) a first gain boost amplifier having first and second inputs coupled to the drains of the first and input MOSFETs and an output coupled to a gate of the second cascode MOSFET, and a second gain boost amplifier having first and second inputs coupled to the drains of the third and fourth input MOSFETs and an output coupled to a gate of the fourth cascode MOSFET;

(g) an output stage including a first output MOSFET of the second channel type having a source coupled to the first supply voltage rail, a drain coupled to an output conductor, and a gate coupled to a drain of the second cascode MOSFET and to a first terminal of a class AB bias circuit, and a second output MOSFET having a source coupled to the second supply voltage rail, a drain coupled to the output conductor, and a gate coupled to a drain of the fourth cascode MOSFET and a second terminal of the class AB bias circuit; and (h) a bias circuit including a fifth cascode MOSFET of the first channel type having a gate coupled to the second bias voltage source and a source coupled to a first terminal of a third current source having a second terminal coupled to the second supply voltage rail, a bias amplifier having a first (−) input coupled to the source of the fifth cascode MOSFET, a second input (+) coupled to the second terminal of the third current source MOSFET, and an output coupled to gates of the third and fourth current source MOSFETs.

17. A differential amplifier with a rail-to-rail common mode input voltage range, comprising:

(a) a first supply voltage rail and a second supply voltage rail;

(b) first and second input terminals for receiving a differential input signal;

(c) a rail-to-rail input stage including
i. first and second input MOSFETs of a first channel type each including a source coupled to a first terminal of a first current source having a second terminal coupled to the first supply voltage rail, and
ii. third and fourth input MOSFETs of a second channel type each including a source coupled to a first terminal of a second current source having a second terminal coupled to the second supply voltage rail;

(d) a first current summing circuit including first and second current source MOSFETs of the second channel type each having a source coupled to the first supply voltage rail, the first current source MOSFET having a drain coupled to a drain of the first input MOSFET and a source of a first cascode MOSFET, the second current source MOSFET having a drain coupled to a drain of the second input MOSFET and a source of a second cascode MOSFET, a gate of each of the first and second cascode MOSFETs being coupled to a first reference voltage;

(e) a second current summing circuit including third and fourth current source MOSFETs of the first channel type each having a source coupled to the second supply voltage rail, the third current source MOSFET having a drain coupled to a drain of the third input MOSFET and a source of a third cascode MOSFET, the fourth current source MOSFET having a drain coupled to a drain of the fourth input MOSFET and a source of a fourth cascode MOSFET, the third and fourth cascode MOSFETs each having a gate coupled to a second reference voltage;

(f) an output stage including a first output MOSFET of the second channel type having a source coupled to the first supply voltage rail, a drain coupled to an output conductor, and a gate coupled to a drain of the second cascode MOSFET and to a first terminal of a class AB bias circuit, and a second output MOSFET having a source coupled to the second supply voltage rail, a drain coupled to the output conductor, and a gate coupled to a drain of the fourth cascode MOSFET and a second terminal of the class AB bias circuit; and (g) a bias circuit including a fifth cascode MOSFET of the first channel type having a gate coupled to the second bias voltage source and a source coupled to a first terminal of a third current source having a second terminal coupled to the second supply voltage rail, a bias amplifier having a first (−) input coupled to the source of the fifth cascode MOSFET, a second input (+) coupled to the second terminal of the third current source MOSFET, and an output coupled to gates of the third and fourth current source MOSFETs.

* * * * *